United States Patent [19]

Harvey et al.

[11] Patent Number: 4,581,629
[45] Date of Patent: Apr. 8, 1986

[54] LIGHT EMITTING DEVICES

[75] Inventors: Maria Harvey; Robert E. Harwood, both of Princeton, N.J.

[73] Assignee: RCA Corporation, Princeton, N.J.

[21] Appl. No.: 505,492

[22] Filed: Jun. 17, 1983

[51] Int. Cl.[4] .............................................. H01L 23/36
[52] U.S. Cl. ...................................... 357/81; 357/17; 372/36
[58] Field of Search ...................... 357/81, 17; 372/36; 313/499, 500

[56] References Cited

U.S. PATENT DOCUMENTS

| | | | |
|---|---|---|---|
| 3,614,550 | 10/1971 | Marinace et al. | 317/234 R |
| 3,869,702 | 3/1975 | Backhouse et al. | 357/74 |
| 3,878,556 | 4/1975 | Nyul | 372/36 |
| 4,144,504 | 3/1979 | Leggett et al. | 331/94.5 P |

Primary Examiner—James W. Davie
Assistant Examiner—Georgia Y. Epps
Attorney, Agent, or Firm—Birgit E. Morris; Theodore R. Furman

[57] ABSTRACT

An improved light emitting device, comprising a light emitting element affixed to a tapered quadrilateral mounting surface of a copper heatsink, is disclosed. The tapered mounting surface includes two slightly divergent mounting edges whereby the width of the mounting surface varies to accommodate light emitting elements of varying sizes. The angle of divergence between the two mounting edges should be kept small to provide accurate facet-to-edge alignment of the light emitting element to the mounting surface.

3 Claims, 5 Drawing Figures

LIGHT EMITTING DEVICES

The Government has rights in this invention pursuant to a Government Contract.

This invention relates to improved light-emitting devices, such as lasers. More particularly, the invention is concerned with light-emitting devices where both the front and back emitting facets of the light emitter are used.

BACKGROUND OF THE INVENTION

In the manufacture of a semiconductor light emitting device such as a laser, the light emitting element is soldered or bonded to a mount. The mount is typically a good thermal conductor, such as copper, which heatsinks the light emitting element to alleviate any damage that could result from the heat buildup which is typical during operation.

In mounting a laser diode it is critical to accurately align the lasing facet of the diode with the edge of the mount. If the laser diode extends beyond the edge of the mount, the hottest part of the laser, the lasing facet, will not be adequately cooled by the heatsink. However, if the laser diode is mounted back from the edge of the mount, an interference effect caused by reflection of some of the light by the mount surface scatters the rest of the light beam.

More recent applications of the semiconductor laser require the use of both front and back lasing facets. Therefore, based on the stringent requirements for aligning the edge of the diode with the edge of the mount, it becomes apparent that the mount dimensions must correspond to the diode dimensions. Machining mounts to precise sizes is not a problem. However, in cleaving or dicing a processed semiconductor wafer into diodes, it can be very difficult to get exact sizes of the diodes. In high volume production of semiconductor laser devices the devices do indeed vary in size and it is not practical to custom-make mounts for all possible diode sizes.

It would be desirable therefore to have a mount which could simplify a mass production mounting process in which both facets of variably sized light emitting elements must be aligned with the edges of a mount.

SUMMARY OF THE INVENTION

The improved light emitting device of the present invention comprises a light emitting element affixed to a tapered quadrilateral mounting surface of a copper heatsink, which mounting surface has two slightly divergent mounting edges whereby the width of the mounting surface varies to accommodate light emitting elements of varying sizes. The angle of divergence between the two mounting edges should be kept small to provide accurate facet-to-edge mounting of the light emitting element to the mounting surface.

DETAILED DESCRIPTION OF THE INVENTION

The light emitting device of the present invention includes a mounting surface which can accommodate variably sized light emitting elements, such as laser diodes. This becomes very important in applications where both of the opposed emitting facets of a light emitting element are utilized. Because of the stringent requirements for aligning an emitting facet to an edge of a mounting surface, it becomes apparent that for double-sided emitting devices the mounting surface must have a width substantially equal to the facet-to-facet dimension of the light emitting element. Therefore, mounting surfaces have typically been pre-machined to a specific light emitting element size. The difficulty arises with oversized and undersized light emitting elements.

Figure 1:
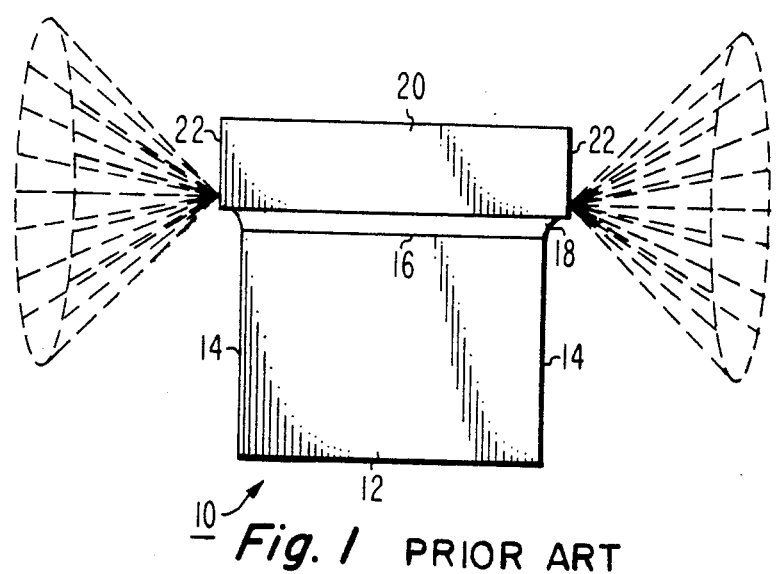
FIG. 1 illustrates a prior art device comprising slightly oversized light emitting element affixed to a prior art mount.

FIG. 1 illustrates a prior art light emitting device 10 comprising a copper heatsink 12 with mounting edges 14 and a mounting surface 16. A solder 18, or other suitable bonding material, holds a slightly oversized light emitting element 20 onto the surface 16. A typical light beam pattern, as shown in FIG. 1, is emitted from each of the emitting facets 22. It is apparent that the emitting facets 22 extend beyond the mounting edges 14 of the copper heatsink 12. Therefore, heat which builds up in the light emittng element 20 during operation cannot be properly dissipated by the copper heatsink 12 from the facets 22, which are the hottest part of the light emitting element 20. Excessive heat buildup in the light emitting element 20 causes structural and operational degradation and premature failure of the light emitting element 20 may occur.

Figure 2:
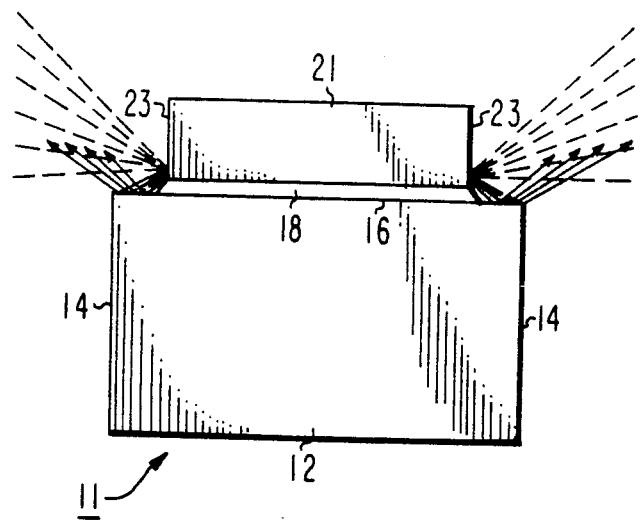
FIG. 2 illustrates a prior art device comprising slightly undersized light emitting element affixed to a prior art mount.

FIG. 2 illustrates a prior art light emitting device 11 comprising a copper heatsink 12 with mounting edges 14 and a mounting surface 16. A slightly undersized light emitting element 21 is affixed to the mounting surface 16 by solder 18, or other suitable bonding material. It can be seen from FIG. 2 that the emitting facets 23 of the undersized light emitting element 21 are recessed from the mounting edges 14. This allows emitted light to impinge on the mounting surface 16, as show in FIG. 2, causing a reflection back into the beam, as shown by the arrows, creating detrimental interference in the beam pattern.

Figure 3:
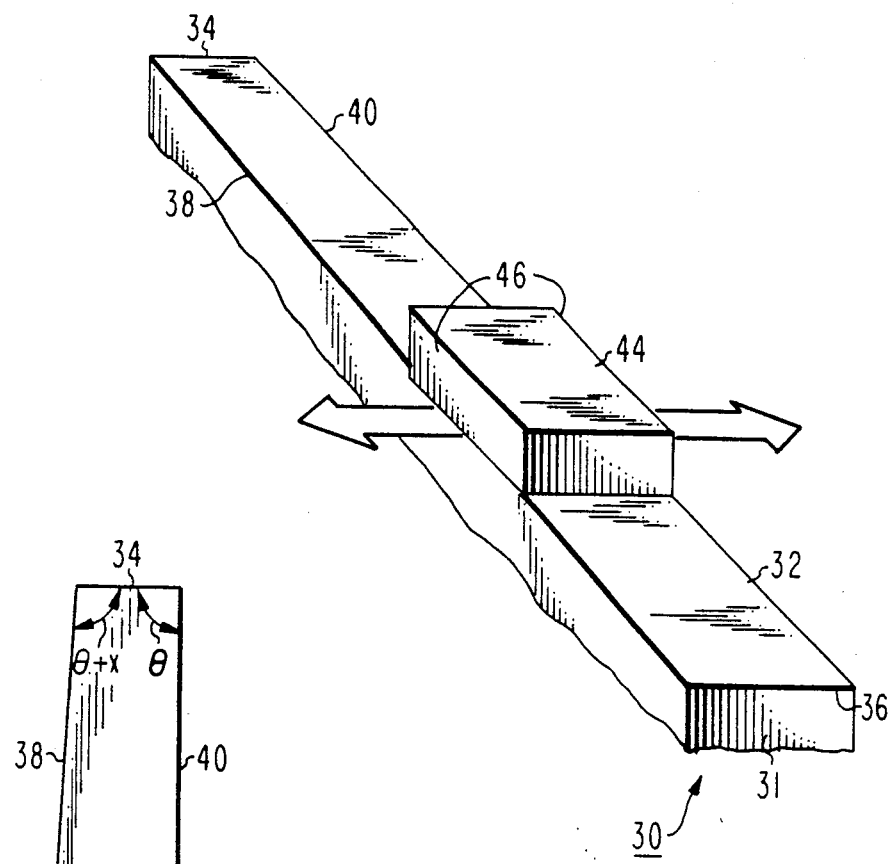
FIG. 3 illustrates a device in accordance with the present invention comprising a light emitting element affixed to a tapered quadrilateral mounting surface

In accordance with the present invention, FIG. 3 illustrates a light emitting device 30 which includes a copper heatsink 31 with a tapered quadrilateral mounting surface 32 thereon. The tapered quadrilateral mounting surface 32 comprises a narrow edge 34 and a wider edge 36, which are parallel to each other, and which are connected by two divergent mounting edges 38 and 40. The dimensions of the narrow edge 34 and the wider edge 36 are chosen to accord with the range of sizes of light emitting elements the mounting surface 32 is to accommodate. For example, in dicing a processed semiconductor wafer into elements which are to have a facet-to-facet dimension of 200 micrometers ($\mu$m), it is found that the elements actually range in size from 150 $\mu$m to 250 $\mu$m. Thus, heatsink 31 in accordance with the present invention would include a tapered surface 32 with a 150 $\mu$m narrow edge 34 and a 250 $\mu$m wider edge 36. The device 30 further comprises a light emitting element 44 with emitting facets 46 which emit a beam or pattern of light in the direction indicated by the arrows. As long as element 44 has dimensions within the limits of the narrow edge 34 and the wider edge 36, it can be mounted at that point along surface 32 where optimum edge-to-edge alignment of both emitting facets 46 to mounting edges 38 and 40 is provided.

Figure 4:
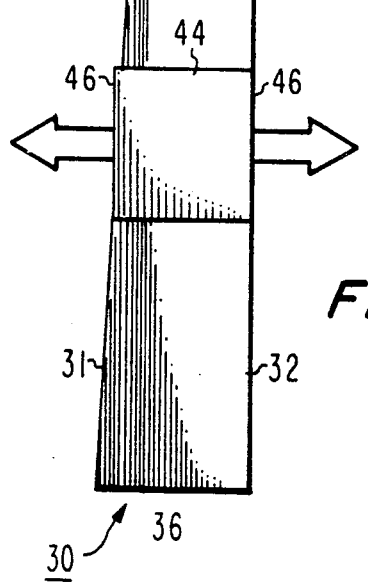
FIG. 4 is a top view of the device of FIG. 3.

FIG. 4, also in accordance with the present invention, and which is a top view of the device 30 of FIG. 3, illustrates the extent to which mounting edges 38 and 40 are divergent. A convenient way to consider the degree of divergence of the mounting edges 38 and 40 is to look at the angles they form in intersecting the narrow edge 34. This angle $\theta$ is formed by the mounting edge 40 and the narrow edge 34 on the surface 32. The angle formed by the mounting edge 38 and the narrow edge 34 is 74+x, wherein x is the angle of divergence between the mounting edges 38 and 40. The angle of divergence x provides that the width of the surface 32 increases as the mounting edges 38 and 40 approach the wider edge 36. As a practical matter however, the angle of divergence x should be kept relatively small so as to provide that the mounting edges 38 and 40 are close to being parallel for proper facet-to-edge alignment of the facets 46 to the mounting edges 38 and 40. For example, in the case where the narrow edge 34 is made to be 150 $\mu$m and the wider edge 36 is made to be 250 $\mu$m, a suitable value for the angle of divergence x, in order to provide successful alignment of element 44, is found to be 45 minutes. Although for a taper to exist on the surface 32, as per the present invention, it is necessary for the mounting edges 38 and 40 to be non-parallel, choosing a small value for x maintains edges 38 and 40 to be slightly divergent for purposes of accommodating variable element sizes, but substantially parallel for purposes of facet-to-edge alignment. For most applications, the angle of divergence x should be less than or equal to 1°.

Although FIGS. 3 and 4 illustrate a device 30 comprising a simple one piece heatsink 31 including a tapered mounting surface 32 with a light emitting element 44 affixed thereto, it should be apparent that the invention contained therein could be incorporated into, and would certainly benefit, various devices comprising elements affixed to various types of mounts, heatsinks or headers. One such embodiment is illustrated in FIG. 5.

Figure 5:
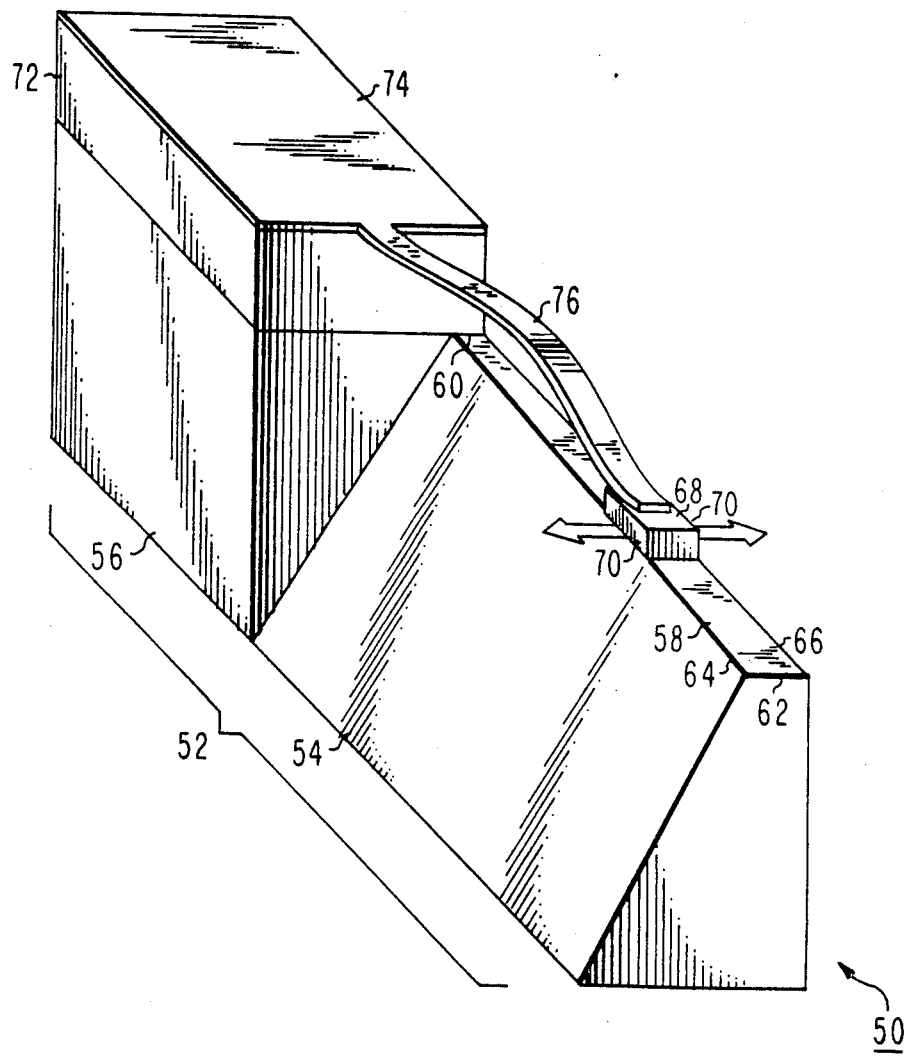
FIG. 5 illustrates a light emitting device according to the present invention.

FIG. 5 in accordance with the present invention illustrates a double-sided light emitting device 50 wherein an integral heatsink 52 has dimensions substantially greater than the tapered quadrilateral mounting surface 58 to obviate the need for handling impractically small devices and to assure adequate heat dissipation. Integral heatsink 52 comprises an element support 54 and an electrode support 56 and is typically made of copper. The copper heatsink 52 may also be coated with one or more metal coatings as is known in the art.

The element support 54 is depicted to be somewhat wedge-shaped with a tapered quadrilateral mounting surface thereon. The tapered surface 58 comprises a narrow edge 60 and a wider edge 62 connected by two slightly divergent mounting edges 64 and 66. The light emitting element 68 is affixed to the tapered surface 58 by any convenient means known in the art, such as soldering or bonding. The emitting facets 70 of the element 68 are aligned with the mounting edges 64 and 66.

The electrode support 56 supports an electrode tab 74 which has a flexible electrode lead 76 extending therefrom. An electrical insulator 72 is interposed between the electrode support 56 and the electrode tab 74. The electrode tab 74 and lead 76 are typically gold or a gold-coated metal. The electrode lead 76 is secured to the light emitting element 68 by an convenient soldering or bonding technique.

In constructing the device 50 of FIG. 5, all parts except the light emitting element 68 are machined and preassembled. The preassembled unit, less the emitting element 68, can then be cleaned and metallized if necessary. Typically, layers of nickel, gold and/or other suitable coatings are applied. Using magnification, the light emitting element 68 can be positioned in a location along the tapered surface 58 where proper facet-to-edge alignment of the facets 70 to the mounting edges 64 and 66 is provided. The light emitting element 68 is then soldered or bonded in the selected location on surface 58 and then the electrode lead 76 is soldered or bonded to the light emitting device 68.

The light emitting device of the present invention provides accurate facet-to-edge alignment of double sided emitters to the mounting edges of a heatsink by incorporating a tapered mounting surface. The tapered mounting surface obviates the need for custom made mounts because its varying width can accommodate light emitting elements of varying dimensions in a simple fashion suitable for high volume production of light emitting devices.

What is claimed is:

1. In a light emitting device which comprises a copper heatsink, including a mounting surface, with a light emitting element affixed thereto, which element includes two opposite emitting facets, wherein the improvement comprises a tapered quadrilateral mounting surface comprising a narrow edge and a wider edge, parallel to each other; and two opposite divergent mounting edges, to which said emitting facets of said light emitting element are substantially aligned; and wherein the dimensions of said narrow edge and said wider edge are in accordance with a desired range of sizes of light emitting elements whereby said mounting surface can provide accurate facet-to-mounting edge alignment for various sizes of light emitting elements within the desired range.

2. The light emitting device of claim 1 wherein the angle of divergence between said mounting edges is less than or equal to 1°.

3. The light emitting element of claim 1 wherein said copper heatsink is coated with one or more coatings selected from the group consisting of nickel, gold, and copper.

* * * * *

UNITED STATES PATENT AND TRADEMARK OFFICE
CERTIFICATE OF CORRECTION

PATENT NO. : 4,581,629

DATED : April 8, 1986

INVENTOR(S): Maria Harvey et al.

It is certified that error appears in the above-identified patent and that said Letters Patent is hereby corrected as shown below:

Column 3, line 17, "74 + x," should be --∅ + x,--.

Signed and Sealed this

Fifteenth Day of July 1986

[SEAL]

Attest:

Attesting Officer

DONALD J. QUIGG

Commissioner of Patents and Trademarks